US006191611B1

United States Patent
Altaf

(10) Patent No.: US 6,191,611 B1
(45) Date of Patent: Feb. 20, 2001

(54) DRIVER CIRCUITRY FOR PROGRAMMABLE LOGIC DEVICES WITH HIERARCHICAL INTERCONNECTION RESOURCES

(75) Inventor: K. Risa Altaf, Sunnyvale, CA (US)

(73) Assignee: Altera Corporation, San Jose, CA (US)

( * ) Notice: Under 35 U.S.C. 154(b), the term of this patent shall be extended for 0 days.

(21) Appl. No.: 09/160,286

(22) Filed: Sep. 25, 1998

Related U.S. Application Data

(60) Provisional application No. 60/062,476, filed on Oct. 16, 1997.

(51) Int. Cl.[7] ................................................. H03K 19/177
(52) U.S. Cl. ................................................. 326/39; 326/37
(58) Field of Search .................................. 326/37–39, 41

(56) References Cited

U.S. PATENT DOCUMENTS

| Re. 34,363 | 8/1993 | Freeman | 307/465 |
|---|---|---|---|
| 3,473,160 | 10/1969 | Wahlstrom | 340/172.5 |
| 4,020,469 | 4/1977 | Manning | 340/172.5 |
| 4,124,899 | 11/1978 | Birkner et al. | 364/716 |
| 4,546,273 | 10/1985 | Osman . | |
| 4,642,487 | 2/1987 | Carter | 307/465 |
| 4,706,216 | 11/1987 | Carter | 365/154 |
| 4,717,912 | 1/1988 | Harvey et al. | 340/825 |
| 4,727,268 | 2/1988 | Hori | 307/465 |
| 5,015,884 | 5/1991 | Agrawal et al. | 307/465 |
| 5,258,668 | 11/1993 | Cliff et al. | 307/465 |
| 5,260,611 | 11/1993 | Cliff et al. | 307/465 |
| 5,267,187 | 11/1993 | Hsieh et al. | 364/784 |
| 5,317,212 | 5/1994 | Wahlstrom | 307/465 |

(List continued on next page.)

FOREIGN PATENT DOCUMENTS

| 1 444 084 | 6/1972 | (GB) . |
| WO 95/16993 | 6/1995 | (WO) . |

OTHER PUBLICATIONS

Altera Corporation, "MAX 5000/EPS464 Programmable Logic Device Family", *Altera Data Book*, Aug. 1993, ver. 1, pp. 149–160.

Altera Corporation, "MAX 7000 Programmable Logic Device Family", *Altera Data Book*, Aug. 1993, ver. 1, pp. 69–81.

D. Bursky, "Fine–Grain FPGA Architecture Uses Four Levels of Configuration Hierarch", *Electronic Design*, vol. 41, No. 20, pp. 33–34 (Oct. 1, 1993).

D. Bursky, "FPGA Advances Cut Delays, Add Flexibility", *Electronic Design*, vol. 40, No. 20, pp. 35, 38, k40, 42–43 (Oct. 1992).

(List continued on next page.)

*Primary Examiner*—Jon Santamauro
(74) *Attorney, Agent, or Firm*—Fish & Neave; Robert R. Jackson

(57) ABSTRACT

A programmable logic device has logic array blocks ("LABs") and interconnection resources. For interconnecting signals to, from, and between the LABs, the global interconnection resources may include switch boxes, long lines, double lines, single lines, and half- and partially populated multiplexer regions. The LAB includes two levels of function blocks. In a preferred embodiment, there is one four-input second-level function block for every four-input first-level function blocks. At least one tri-state buffer is provided in each LAB. Each tri-state buffer may receive a data signal either from one or more function blocks in the associated LAB or from one or more interconnection conductors adjacent to the LAB. The tri-state buffer may buffer one of the received data signals and apply the resulting buffered signal to one or more of the interconnection conductors adjacent to the LAB.

13 Claims, 7 Drawing Sheets

U.S. PATENT DOCUMENTS

| | | | |
|---|---|---|---|
| 5,338,984 | | 8/1994 | Sutherland ........................ 307/465.1 |
| 5,367,209 | * | 11/1994 | Hauck et al. ........................ 326/41 |
| 5,375,086 | | 12/1994 | Wahlstrom ........................ 365/149 |
| 5,442,306 | * | 8/1995 | Woo ........................ 326/39 |
| 5,444,394 | | 8/1995 | Watson et al. ........................ 326/45 |
| 5,473,266 | | 12/1995 | Ahanin et al. ........................ 326/41 |
| 5,504,440 | * | 4/1996 | Sasaki ........................ 326/39 |
| 5,546,018 | | 8/1996 | New et al. ........................ 326/38 |
| 5,550,782 | * | 8/1996 | Cliff et al. ........................ 326/40 |
| 5,557,217 | | 9/1996 | Pederson ........................ 326/39 |
| 5,773,994 | * | 6/1998 | Jones ........................ 326/41 |

OTHER PUBLICATIONS

R. Cliff et al., "A Dual Granularity and Globally Interconnected Architecture for a programmable Logic Device", *Proceedings of the IEEE 1993 Custom Integrated Circuits Conference*, San Diego, California, pp. 7.3.1–7.3.5 (May 9–12, 1993).

P. de Carvalho, "Les FPGA: La Famille XC4000 Xilinx", *Electronique Radio Plans*, No. 545, pp. 35–39 (Apr. 1993).

Xilinx Corp., "The Programmable Logic Data Book", *XC2000, Logic Cell Array Families*, pp. 2–187 to 2–216 (version 4, Aug. 1994).

F. Heutink, "Implications of Busing for Cellular Arrays", *Computer Design*, pp. 95–100 (Nov. 1974).

H. Fleisher et al., "The Writeable Personalized Chip", *Computer Design*, pp. 59–100 (Jun. 1970).

R.C. Minnick, "A Survey of Microcellular Research", *Journal of the Association of Computer Machinery*, vol. 14, No. 2, pp. 203–241 (Apr. 1967).

J.L. Nichols, "A Logical Next Step for Read Only Memories", *Electronics*, pp. 111–113 (Jun. 1967).

W.H. Kautz, "Programmable Cellular Logic", *Recent Developments in Switching Theory*, Amar Mukhopadlhyay (Ed.) Ch. 4, pp. 369–422 (1971).

S.E. Wahlstrom, "Programmable Logic Arrays—Cheaper by the Millions", *Electronics*, pp. 90–95 (Dec. 1967).

R.G. Shoup, "Programmable Cellular Logic Arrays", (*Dissertation*), *Carnegie–Mellon University*,(Mar. 1970).

* cited by examiner

DRIVER CIRCUITRY FOR PROGRAMMABLE LOGIC DEVICES WITH HIERARCHICAL INTERCONNECTION RESOURCES

This invention claims the benefit of United States provisional patent application No. 60/062,476, filed Oct. 16, 1997, which is hereby incorporated by reference in its entirety

BACKGROUND OF THE INVENTION

This invention relates to programmable logic devices, and more particularly to driver circuitry usable in programmable logic devices with increased logic and interconnection capability.

Programmable logic devices are well known as is shown, for example, by Pedersen et al. U.S. Pat. No. 5,260,610, Cliff et al. U.S. Pat. No. 5,260,611, Cliff et al. U.S. Pat. No. 5,689,195, Cliff U.S. Pat. No. 5,815,726, Cliff et al. U.S. Pat. No. 5,909,126 Reddy et al. U.S. Pat. No. 5,977,793, McClintock et al. U.S. Pat. No. 5,999,016, and Pedersen U.S. patent application Ser. No. 09/022,663, filed Feb. 12, 1998. All of these references are hereby incorporated by reference herein in their entirety.

Programmable logic devices can include a plurality of super-regions of programmable logic disposed on the device in a two-dimensional array of intersecting rows and columns of such super-regions. Each super-region may include a plurality of regions of programmable logic. Each region may include a plurality of subregions of programmable logic. Each subregion may include (1) a four-input look-up table which is programmable to produce an output signal that is any logical combination of the four inputs applied to the look-up table, (2) a register (flip-flop) for registering the output signal of the look-up table, and (3) circuitry for allowing the final output of the subregion to be either the registered or unregistered output signal of the look-up table.

Interconnection conductors are provided on the device for conveying signals to, from, and between the subregions in each region, as well as to, from, and between the regions and super-regions. For example, horizontal interconnection conductors may be associated with each row of regions for conveying signals to, from, and between the regions in the associated row. Vertical interconnection conductors may be associated with each column of regions for conveying signals to, from, and between the rows. And local conductors may be associated with each region for conveying signals to, from, and between the subregions in that region. Programmable interconnections are provided for making connections between the various types of interconnection conductors so that signals can be routed throughout the device in a great many different ways. For example, the local conductors associated with each region may be programmably interconnectable to the horizontal and/or vertical conductors adjacent to that region. Similarly, intersecting horizontal and vertical conductors may be programmably interconnectable.

Various kinds of drivers may be provided for driving signals from the subregions out onto the adjacent interconnection conductors. For example, certain of the horizontal and vertical conductors adjacent to each region may be driven by the output signals of that region's subregions via a buffer and an NMOS pass gate. Each such buffer may be capable of driving one or more horizontal and/or vertical conductors. Each pass gate is controlled by an associated static programmable element. Alternative driver circuitry involves the use of tri-state drivers feeding tri-state lines.

The enable signal for each tri-state buffer is generated elsewhere on the device or comes from an input pin. Thus each such enable signal must be explicitly routed to each tri-state driver that it controls. This can result in extra delay in the enable path and may require considerable routing resources.

In view of the foregoing, it is an object of this invention to provide improved driver circuitry for programmable logic devices.

It is a more particular object of this invention to provide improved tri-state-type driver circuitry for programmable logic devices.

SUMMARY OF THE INVENTION

These and other objects of the invention are accomplished in accordance with the principles of the invention by providing a new programmable logic device architecture with an improved logic array block ("LAB") and improved interconnection resources. For interconnecting signals to and from the LABs, the global interconnection resources may include switch boxes, long lines, double lines, single lines, and half- and partially populated multiplexer regions. The LAB includes two levels of function blocks. In a preferred embodiment, in a first level, there are eight four-input function blocks. In a second level, there are two four-input function blocks. In another preferred embodiment there are 16 first-level and four second-level four-input function blocks. At least one tri-state buffer is provided. The tri-state buffer may be programmably coupled to receive signals from and send signals to the LABs without passing through the global interconnection resources. The tri-state buffer may also be programmably coupled to receive signals from and send signals to the global interconnection resources. In one embodiment, the function blocks are implemented using look-up tables ("LUTs"). The LAB may contain storage blocks for implementing sequential or registered logic functions.

Further features of the invention, its nature and various advantages will be more apparent from the accompanying drawings and the following detailed description of the preferred embodiments.

DETAILED DESCRIPTION OF THE PREFERRED EMBODIMENTS

Various aspects of the invention will first be described with reference to embodiments of the types shown in FIGS. 1–6. Illustrative uses of the programmable logic devices of the invention will then be described with reference to FIG. 7.

It will be understood that terms like "row" and "column", "horizontal" and "vertical", "left" and "right", "upper" and "lower", and other directional or orientational terms are used herein only for convenience, and that no fixed or absolute directions or orientations are intended by the use of these terms. For example, the words in each of the word pairs mentioned above can be reversed if desired.

Figure 1:
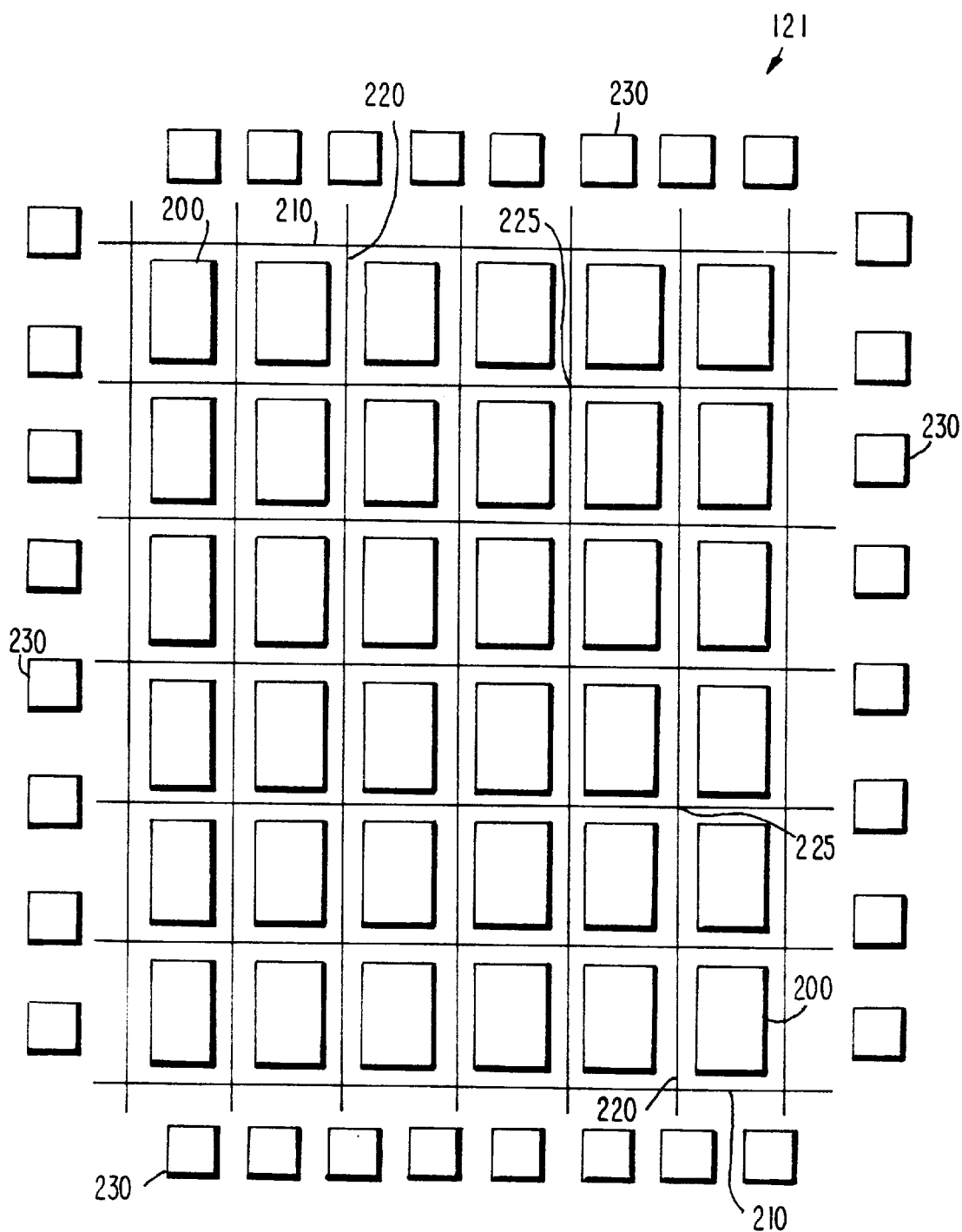
FIG. 1 is a simplified plan view of a portion of an illustrative embodiment of a programmable logic device with which this invention can be used.

FIG. 1 is a simplified block diagram of the overall internal architecture and organization of a programmable logic device ("PLD") 121. Many details of PLD architecture, organization, and circuit design are not necessary for an understanding of the present invention and such details are not shown in FIG. 1.

FIG. 1 shows a six-by-six two-dimensional array of thirty-six logic array blocks ("LABs") 200. Each LAB 200 is a physically grouped set of logical resources that is configured or programmed to perform logical functions. The internal architecture of a LAB will be described in more detail below in connection with FIGS. 3 and 4. PLDs may contain an arbitrary number of LABs, more or less than the PLD 121 shown in FIG. 1. Generally, in the future, as technology advances and improves, programmable logic devices with even greater numbers of logic array blocks will undoubtedly be created. Furthermore, LABs 200 need not be organized in a square matrix; for example, the array may be organized in a five-by-seven or a twenty-byseventy matrix of LABs.

LAB 200 has inputs and outputs (not shown) which may be programmably connected to a global interconnect structure, comprising an array of global horizontal interconnects ("GHs") 210 and global vertical interconnects ("GVs") 220. Although shown as single lines in FIG. 1 each GH 210 and GV 220 line represents a plurality of signal conductors. The inputs and outputs of LAB 200 are programmably connectable to an adjacent GH 210 and an adjacent GV 220. Utilizing GH 210 and GV 220 interconnects, multiple LABs 200 may be connected and combined to implement larger, more complex logic functions than can be realized using a single LAB 200.

In one embodiment, GH 210 and GV 220 conductors are programmably connectable at intersections 225 of these conductors. Moreover, GH 210 and GV 220 conductors may make multiple connections to other GH 210 and GV 220 conductors. Various GH 210 and GV 220 conductors may be programmably connected together to create a signal path from a LAB 200 at one location on PLD 121 to another LAB 200 at another location on PLD 121. Furthermore, an output signal from one LAB 200 can be directed into the inputs of one or more LABs 200. Also, using the global interconnect, signals from a LAB 200 can be fed back into the same LAB 200. In other embodiments or the present invention, only selected GH 210 conductors are programmably connectable to a selection of GV 220 conductors. Furthermore, in still further embodiments, GH 210 and GV 220 conductors way be specifically used for passing a signal in a specific direction, such as input or output, but not both. For example, one or more GH 210 or GV 220 conductors may be used as a dedicated input driver or dedicated clock network to drive the LABs 200 from an input pin of the integrated circuit.

The PLD architecture in FIG. 1 further shows at the peripheries of the chip, input-output drivers 230. Input-output drivers 230 are for interfacing the PLD to external, off-chip circuitry. FIG. 1 shows thirty-two input-output drivers 230; however, a PLD may contain any number of input-output drivers, more or less than the number depicted. Each input-output driver 230 is configurable for use as an input driver, output driver, or bidirectional driver. An input driver takes signals from outside the chip and interfaces them to on-chip circuitry. An output driver takes internal signals and interfaces them to the outside world. A bidirectional driver performs the functions of both an input driver and an output driver. In addition, a bidirectional driver has a highimpedance mode which allows the driver to interface with a bidirectional bus. In other embodiments of the present invention, a PLD may have dedicated input drivers and dedicated output drivers, as well as special "fast" input drivers and the like.

Like LABs 200, input-output drivers 230 are programmably connectable to adjacent GH 210 and GV 220 conductors. Using GH 210 and GV 220 conductors, input-output drivers 230 are programmably connectable to any LAB 200. Input-output drivers 230 facilitate the transfer of data between LABs 200 and external, off-chip circuitry. For example, off-chip logic signals from other chips may be coupled through input-output drivers 230 to drive one or more LABs 200. Based on these off-chip inputs and the logical functions programmed into LABs 200, LABs 200 will generate output signals that are coupled through the global interconnect to input-output drivers 230 for interfacing with off-chip circuitry.

Figure 2:
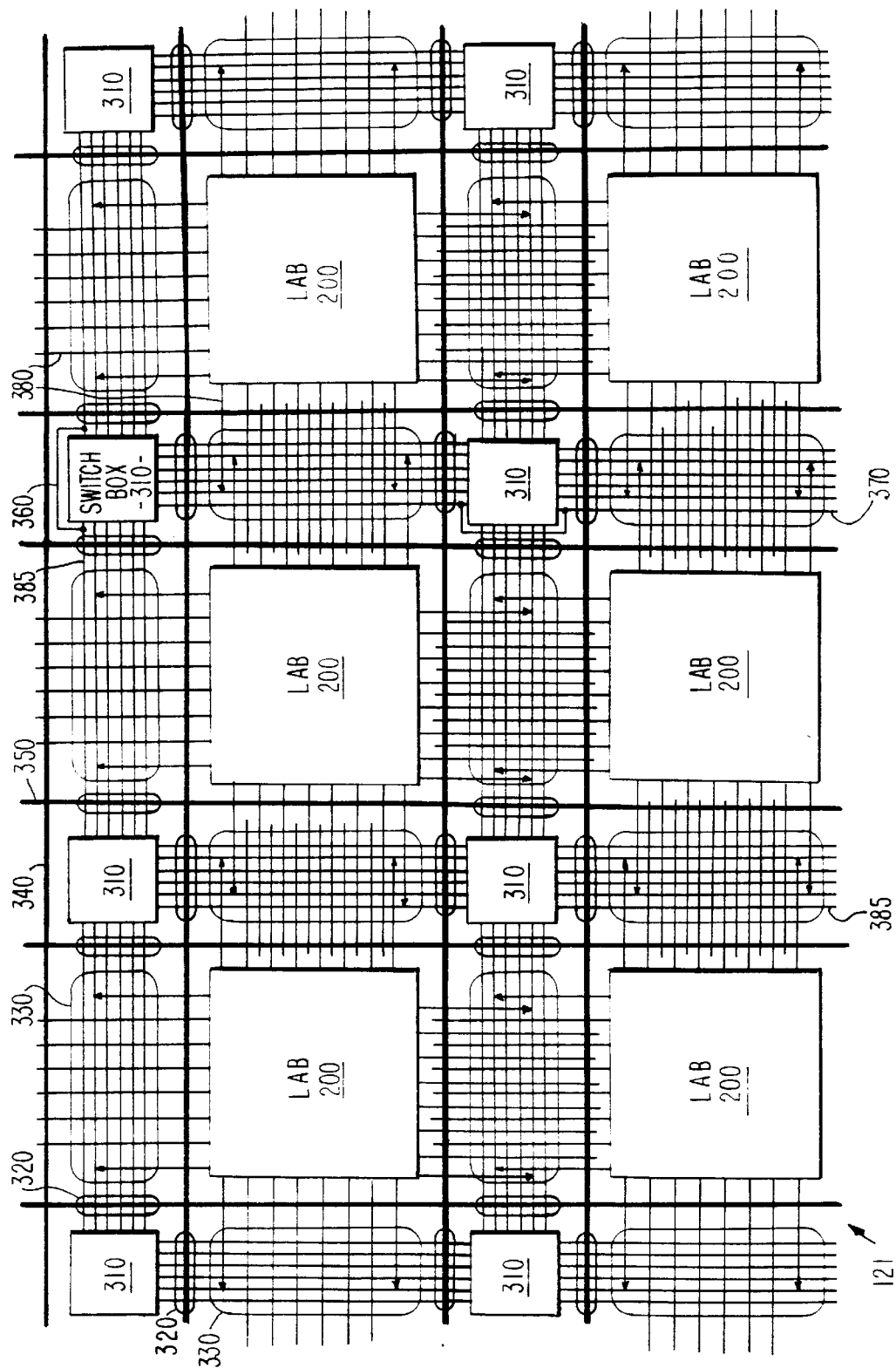
FIG. 2 is a somewhat more detailed, but still simplified, plan view of an illustrative embodiment of a representative portion of the FIG. 1 apparatus.

FIG. 2 shows a further embodiment of an overall internal architecture and organization of PLD 121 of FIG. 1. PLD 121 of FIG. 2 includes LABs 200, which are physically grouped sets of logical resources that are configured or programmed to perform logical functions. FIG. 2 shows six LABs, arranged in a two-by-three matrix. However, PLD 121 may have any arbitrary number of LABs, more or less than shown in FIG. 2. Furthermore, PLD 121 may be organized in any arbitrary format such as a ten-by-twelve. The internal architecture of a LAB 200 will be described in more detail below.

LABs 200 of FIG. 2 are programmably connectable, as described above in FIG. 1 using global interconnection resources. As in FIG. 1 the global interconnection resources of FIG. 2 are also organized in horizontal and vertical directions. Using these global interconnection resources, LABs 200 may be programmably combined to form larger, more complex logic functions than are available from a single LAB. The global interconnection resources of FIG. 2 specifically include switch boxes 310, partially populated multiplexer regions 320, half-populated multiplexer regions 330, horizontal long lines 340, vertical long lines 350, horizontal double lines 360, and vertical double lines 370.

Furthermore, FIG. 2 shows only a portion of PLD 121. PLD 121 may also contain input-output drivers 230 (not shown), as in FIG. 1, for interfacing PLD 121 with off-chip circuitry. As in FIG. 1, input-output drivers 230 (not shown) are programmably connectable using the global interconnection resources.

There are various types of interconnection resources, distinguishable on the basis of the relative length of their segments. In particular, long lines (also known as "global lines"), including horizontal long lines 340 and vertical long lines 350, are conductors which run the entire length or width of the array. Horizontal long lines 340 extend in a first direction of an array of LABs 200. Vertical long lines 350 extend in a second direction of the array of LABs 200.

Horizontal and vertical long lines 340 and 350 are used to programmably couple signals across the entire PLD 121. In this fashion, multiple LABs 200 may be combined to implement larger, more complex logic functions. Furthermore, long lines 340 and 350 are suitable conductors for distributing high fan-out, time-critical control signals such as a clock signal throughout a PLD integrated circuit with minimal timing skew. Moreover, long lines 340 and 350 may be fashioned into a bidirectional, tristatable bus. In one embodiment, PLD 121 may include long lines dedicated for a particular function, such as a dedicated clock line for routing a clock network.

As shown in FIG. 2, LABs 200 have inputoutput lines 380 for receiving and providing logic signals. LAB input-output lines 380 include bidirectional paths, which may be programmed or configured as an input or an output. Furthermore, LAB input-output lines 380 may include dedicated inputs and dedicated outputs. Moreover, LAB input-output lines 380 may include a combination of bidirectional paths, dedicated inputs, and dedicated outputs.

Using LAB input-output lines 380, horizontal and vertical long lines 340 and 350 may be used to programmably couple signals to and from LABs 200 in different locations of PLD 121. Specifically, long lines 340 and 350 can provide input signals for a LAB 200 from other LABs 200. Long lines may also be driven by circuitry such as input-output drivers 230 (not shown). Input-output drivers 230 may be used to programmably couple, through long lines 340 and 350, input signals from external, off-chip circuitry and sources to LABs 200.

Specifically, in one embodiment, dedicated outputs from LAB 200, via LAB input-output lines 380, may be programmably coupled directly, without passing through another global interconnection resource, to horizontal long lines 340. In addition, LAB inputoutput lines 380 may also be programmably coupled indirectly to horizontal and vertical long lines 340 and 350 through other global interconnection resources including double lines 360 and 370.

To connect to the dedicated inputs of LAB 200, long lines 340 and 350 may be programmably coupled through partially populated multiplexer region 320 (at intersections of long lines 340 and 350 and double lines 360 and 370) to double lines 360 and 370. From double lines 360 and 370, signals may be programmably coupled through half-populated multiplexer region 330, to LAB input-output lines 380 of LAB 200. In other embodiments of the present invention, horizontal and vertical long lines 340 and 350 may be programmably coupled directly to the dedicated inputs of LAB 200 or selected LABs 200.

By not providing a direct programmable input path from long lines 340 and 350 to LABs 200, this reduces the amount of circuitry required in PLD 121. Overall die size of PLD 121 will be reduced without adversely affecting greatly the performance of the integrated circuit. The negative impact on performance will be minimal. For example, timing skew differences between different LABs 200 will be similar because the same delay will be introduced for the input signals into LAB 200. Furthermore, there will be some increases in performance because less circuitry at the inputs of the LABs 200 also results in reduced parasitics such as resistances and capacitances, which tend to degrade performance.

In addition to horizontal and vertical long lines 340 and 350, PLD 121 of FIG. 2 includes double lines 360 and 370 for routing signals within PLD 121. Like long lines 340 and 350, double lines 360 and 370 extend in the horizontal and vertical directions of the array. Horizontal double lines 360 extend in the first direction of the array of LABs 200. Vertical double lines 370 extend in the second direction of the array of LABs 200. Compared to long lines 340 and 350, double lines 360 and 370 support shorter, local connections between two adjacent LABs 200 without using other global interconnection resources such as switch boxes 310 and long lines 340 and 350. To simplify the diagram in FIG. 2, only the referenced double lines 360 and 370 are shown bypassing switch box 310. Although not shown, other double lines in FIG. 3 also programmably couple two adjacent LABs 200 without using switch boxes 310.

As is the case with long lines 340 and 350, double lines 360 and 370 may be used to combine multiple LABs 200 to implement larger, more complex logic functions. Horizontal and vertical double lines 360 and 370 are used, for example, to programmably couple, through half-populated multiplexer region 330, input and output signals (via LAB input-output lines 380) of one LAB 200 to another LAB 200. This path does not pass through switch boxes 310, horizontal long lines 340, or vertical long lines 350. Since double lines 360 and 370 provide shorter-length interconnections than long lines 340 and 350, double lines 360 and 370 generally have better performance characteristics than long lines 340 and 350. Since long lines 340 and 350 are limited resources, using double lines 360 and 370 reserves long lines 340 and 350 for logic functions requiring longer-length signal paths.

Double lines 360 and 370 can drive or be driven by a LAB 200 which has LAB input-output lines 380 crossing, or intersecting, those particular double lines. More specifically, LAB input-output lines 380 may be programmably coupled to double lines 360 and 370 through half-populated input multiplexer region 330 at intersections of double lines and LAB input-output lines. As discussed above, long lines 340 and 350 may be programmably connected to double lines 360 and 370 through partially populated multiplexer regions 320 at intersections of long lines and double lines.

Double lines 360 and 370 may be programmably coupled to other double lines 360 and 370 via switch boxes 310, discussed below. In particular, to couple signals between more than two LABs 200, horizontal and vertical double lines 360 and 370 may be programmably coupled to one another via switch boxes 310, as needed, to implement a particular logic function.

PLD 121 may include single lines 385, which are similar to double lines 360 and 370 except that these only intersect LAB input-output lines 380 of one LAB 200, instead of two. For example, single lines 385 may be programmably coupled to other single lines 385 via switch boxes 310. Single lines 385 may drive or be driven by a LAB 200 which has LAB input-output lines 380 crossing, or intersecting, those particular single lines 385. In some embodiments, however, the global interconnection resources may not include single lines 385. Single lines 385 permit flexibility in interconnecting signals and LABs 200, but for many of the logic designs programmed into PLDs, a LAB 200 must be connected to at least one other LAB 200. In view of these considerations, the circuitry and other overhead required to implement single lines may be excessive, leading to greater power consumption and larger integrated circuit die sizes than necessary. Further, certain interconnection resources such as switch boxes 310 (used to programmably couple multiple single lines 385) may become the limiting factor in the size of the design that may be implemented in the PLD. Therefore, an effective, efficient PLD architecture may include double lines 360 and 370, but not single lines 385.

Still further embodiments may include triple lines, quadruple lines, quintuple lines, sextuple lines, and other similar interconnection resources. Furthermore, in other embodiments there may be special, direct and indirect, connections between LABs 200 that do not pass through the global interconnection resources.

The illustrative structure shown in FIG. 2 can be somewhat like the corresponding portion of the structure shown in above-mentioned Cliff et al. U.S. Pat. No. 5,689,195 (see especially FIG. 3 of that patent). However, FIG. 2 is somewhat simplified as compared to that Cliff et al. FIG. It will be understood that, if desired, additional features from the Cliff et al. structure can be included in regions provided in the present devices. Examples of such possible other features are additional conductors for so-called fast lines and/or clock signals, carry and/or cascade interconnections between logic modules or "subregions" within LABs, register control signals derived from local conductors, etc. The detailed structure of subregions can be as shown in FIG. 8 of the same Cliff et al. reference. For example, some of the features shown in McClintock et al. U.S. Pat. No. 5,614,840, Cliff et al. U.S. Pat. No. 5,541,530, Leong et al. U.S. Pat. No. 5,592,106, Reddy et al. U.S. Pat. No. 5,694,058, Pedersen U.S. Pat. No. 5,872,463 and Cliff et al. U.S. Pat. No. 5,909,126 can be employed if desired. These additional references are also hereby incorporated by reference herein.

Figure 3:
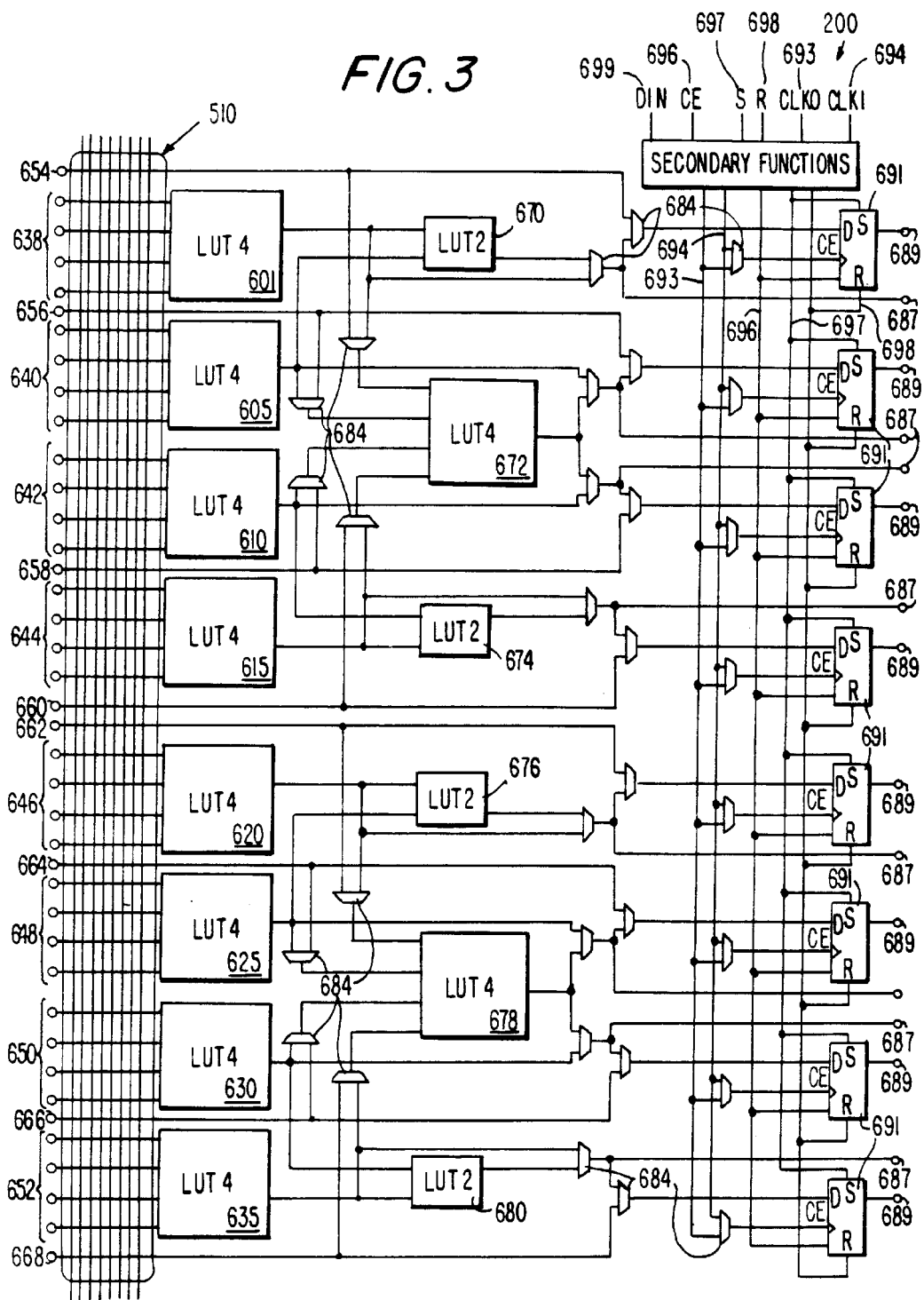
FIG. 3 is an even more detailed, but still simplified plan view of an illustrative embodiment of a representative portion of the FIG. 2 apparatus.

FIG. 3 shows a block diagram of a specific embodiment of LAB 200 which is useful for the present invention. LAB 200 of FIG. 3 is configurable to implement logic functions. LAB 200 has eight "primary" programmable function generators. These primary programmable function generators include "primary" four-input look-up tables ("LUTs") 601, 605, 610, 615, 620, 625, 630, and 635 in a first level.

LUTs are programmable elements configurable to provide a logical function. In-particular, a four-input LUT is configurable to produce the sixteen possible logical outputs for any Boolean operation of the four variables. Instead of a look-up table, LUTs may be designed using other programmable systems for performing and/or functionality such as logic gates, flip-flops, multiplexers, and programmable AND-OR arrays.

In a preferred embodiment, LUTs are implemented using a random access memory ("RAM"). More specifically, LUTs are implemented using a 16-bit RAM, in one specific embodiment, each bit storing an output state corresponding to one of, e.g., sixteen possible input combinations. In further embodiments of the present invention, LUTs may be implemented using other types of memories besides a RAM, such as a first-in, first-out ("FIFO") memory or content-addressable memory ("CAM"), or a combination of these.

A RAM may be constructed using many different fabrication technologies including fuse, antifuse, ferromagnetic core, erasable programmable read-only memory ("EPROM"), and electrically erasable programmable read-only memory ("EEPROM") technology. A RAM may also be constructed from dynamic random access memory ("DRAM") or static random access memory ("SRAM") technology. In a preferred embodiment of the present invention, the LUTs of FIG. 3 use SRAM memory.

LUTs 601, 605, 610, 615, 620, 625, 630, and 635 have four inputs, which are for the four variables used to select a particular output for that LUT. LUT 601 has four inputs 638; LUT 605 has four inputs 640; LUT 610 has four inputs 642; LUT 615 has four inputs 644; LUT 620 has four inputs 646; LUT 625 has four inputs 648; LUT 630 has four inputs 650; and LUT 635 has four inputs 652. These inputs form part of local interconnect structure 510 (described above) and also a portion of LAB input-output lines 380 of FIG. 2. Signals from within and external to LAB 200 may be connected to these inputs. For example, signals from double lines 360 and 370 may be programmably connected to these inputs of LAB 200.

In addition to the primary LUT inputs, the inputs to LAB 200 in local interconnect structure 510 include eight dedicated inputs 654, 656, 658, 660, 662, 664, 666, and 668. A primary four-input LUT is associated with a particular dedicated input. More specifically, dedicated inputs 654, 656, 658, 660, 662, 664, 666, and 668 are associated with primary LUTs 601, 605, 610, 615, 620, 625, 630, and 635, respectively. Dedicated inputs 654, 656, 658, 660, 662, 664, 666, and 668 have multiple uses which are described further below.

These dedicated inputs and the inputs to the LUTs of LAB 200 may be programmably coupled to a signal provided on local interconnect structure 510. In one embodiment, local interconnect structure 510 is a half-populated multiplexer structure. In a half-populated multiplexer structure, only half of the provided signals may be coupled to a particular LUT input. In other embodiments, local interconnect structure 510 may be a fully populated or partially populated multiplexer structure. In a fully populated multiplexer structure, every signal may be coupled to every-LUT input. In a partially populated multiplexer structure, only a selected portion of the signals may be coupled to a particular LUT input.

Conceptually, LAB 200 of FIG. 3 may be divided into two groupings of LUTs, both groupings having substantially similar configurations and connections between elements. In particular, LUTs 601, 605, 610, and 615 form a first LUT grouping; LUTs 620, 625, 630, and 635 form a second LUT grouping. This description will only discuss the connections for LUTs 601, 605, 610, and 615 in detail, since LUTs 620, 625, 630, and 635 are similarly connected.

In addition to primary LUTs 601, 605, 610, 615, 620, 625, 630, and 635, the LAB embodiment shown in FIG. 3 includes six secondary function generators. These secondary function generators include LUTs 670, 672, 674, 676, 678, and 680 in a second level. Generally, the output signals from the primary LUTs are fed, directly and indirectly, into the inputs of the secondary LUTs so that larger, more complex logical functions can be created from the combination of primary and secondary LUTs. Analogous to the two groupings of the primary LUTs, there are preferably two groupings of secondary LUTs. A first grouping of secondary LUTs is associated with the first grouping of primary LUTs. Similarly, a second grouping of secondary LUTs is associated with the second grouping of primary LUTs. The first grouping contains secondary LUTs 670, 672, and 674. The second grouping contains LUTs 676, 678, and 680. This description will only discuss the connections for LUTs 670, 672, and 674 in detail, since LUTs 676, 678, and 680 are similarly connected.

More specifically, for the first grouping of LUTs, regarding secondary two-input LUT 670, an output from primary LUT 601 is directly coupled to one of two inputs to secondary two-input LUT 670. An output from primary LUT 605 is directly coupled to another input of secondary two-input LUT 670. Regarding secondary two-input LUT 674, an output from primary LUT 610 is directly coupled to one of two inputs to secondary two-input LUT 674. An output from primary LUT 615 is directly coupled to another input of secondary two-input LUT 674.

The second grouping of LUTs are similarly connected. Regarding secondary two-input LUT 676, an output from primary LUT 620 is directly coupled to one of two inputs to secondary two-input LUT 676. An output from primary LUT 625 is directly coupled to another input of secondary two-input LUT 676. Regarding secondary two-input LUT 680, an output from primary LUT 630 is directly coupled to one of two inputs to secondary two-input LUT 680. An output from primary LUT 635 is directly coupled to another input of secondary two-input LUT 680.

Secondary two-input LUTs 670, 674, 676, and 680 are used to generate logic functions based on outputs from the specified primary LUT. These secondary LUTs are used to create larger, more complex logic functions than are available with a single primary LUT. In particular, the secondary LUTs facilitate the combination of multiple primary LUTs. For example, secondary two-input LUT 670 can be used to combine primary LUTs 601 and 605 to create a larger five-input LUT for handling functions of up to five variables. Since there are four secondary two-input LUTs 670, 674, 676, and 680 in the embodiment shown in FIG. 3, four five-input logic functions can be implemented.

LAB 200 of FIG. 3 also includes a plurality of programmable multiplexers 684. Multiplexers 684 are programmably configured to couple a multiplexer input to a multiplexer output. Programmable multiplexers 684 may have an arbitrary number of inputs. In FIG. 3, multiplexers 684 are two-input multiplexers. Multiplexers 684 are controlled, or configured, by way of user-programmable memory cells (not shown), such as SRAM bits. Depending upon the state of such user-programmed bits, an appropriate input of multiplexer 684 is programmably coupled to the output of multiplexer 684.

For the first grouping of LUTs, a multiplexer 684 programmably couples dedicated input 654 and the output of primary LUT 601 to a first input of secondary four-input LUT 672. A multiplexer 684 programmably couples an output of primary LUT 605 and dedicated input 656 to a second input of secondary four-input LUT 672. A multiplexer 684 programmably couples an output of primary LUT 610 and dedicated input 658 to a third input of secondary four-input LUT 672. A multiplexer 684 programmably couples an output of primary LUT 615 and dedicated input 660 to a fourth input of secondary four-input LUT 672.

The second grouping of LUTs are similarly connected to secondary four-input LUT 678. Specifically, a multiplexer 684 programmably couples dedicated input 662 and the output of primary LUT 620 to a first input of secondary four-input LUT 678. A multiplexer 684 programmably couples an output of primary LUT 625 and dedicated input 664 to a second input of secondary four-input LUT 678. A multiplexer 684 programmably couples an output of primary LUT 630 and dedicated input 666 to a third input of secondary four-input LUT 678. A multiplexer 684 programmably couples an output of primary LUT 635 and dedicated input 668 to a fourth input of secondary four-input LUT 678.

Secondary four-input LUTs 672 and 678 are used to generate logic functions based on outputs from a combination of primary LUTs and dedicated inputs. These secondary LUTs 672 and 678 are used to create larger, more complex logic functions than are available with a single primary LUT. Secondary LUTs 672 and 678 facilitate the combination of multiple primary LUTs. For example, secondary four-input LUT 672 may be used to combine primary LUTs 601, 605, 610, and 615 to create a larger six-input LUT for handling functions of up to six variables. Since there are two secondary four-input LUTs 672 and 678 in the embodiment shown in FIG. 3, two six-input logic functions can be implemented.

Therefore, in LAB 200 of FIG. 3, two six-input logic functions and four five-input logic functions (see above), and combinations of these, can be implemented. For example, LAB 200 of FIG. 3 has eight four-input LUTs 601, 605, 610, 615, 620, 625, 630, and 635; another two four-input LUTs can be implemented using dedicated inputs 654, 656, 658, 660, 662, 664, 666, and 668, and secondary four-inputs LUTs 672 and 678. In particular, multiplexers 684 are configured to programmably couple dedicated inputs 654, 656, 658, and 660 to secondary four-input LUT 672; and dedicated inputs 662, 664, 666, and 668 are programmably coupled to secondary four-input LUT 678. In this configuration, ten four-input LUTs are available for use.

Primary four-input LUTs 601, 605, 610, 615, 620, 625, 630, and 635 have combinatorial path outputs 687 and registered path outputs 689. LAB 200 has eight combinatorial outputs 687 and eight registered outputs 689. Combinatorial path outputs 687 are used to output results of combinatorial logic functions which depend on the present input states in some predetermined fashion; in FIG. 3, this is governed by the configuration information within the LUTS. Registered path outputs 689 are connected to storage blocks 691. These outputs 689 are used to output registered or sequential logic functions which depend on both the input states and the previous history. Registered (or sequential) functions are implemented using some form of memory circuit, including circuits such as registers, flip-flops, and the like.

Combinatorial outputs 687 are programmably selected using programmable multiplexers 684. For the first grouping of LUTs, a multiplexer 684 programmably couples the output of primary LUT 601 and an output of secondary LUT 670 to a combinatorial output 687. A multiplexer 684 programmably couples the output of primary LUT 605 and an output of secondary LUT 672 to a combinatorial output 687. A multiplexer 684 programmably couples the output of primary LUT 610 and the output of secondary LUT 672 to a combinatorial output 687. A multiplexer 684 programmably couples the output of primary LUT 615 and an output of secondary LUT 674 to a combinatorial output 687.

Similarly, for the second grouping of LUTs, a multiplexer 684 programmably couples the output of primary LUT 620 and an output of secondary LUT 676 to a combinatorial output 687. A multiplexer 684 programmably couples the output of primary LUT 625 and an output of secondary LUT 678 to a combinatorial output 687. A multiplexer 684 programmably couples the output of primary LUT 630 and the output of secondary LUT 678 to a combinatorial output 687. A multiplexer 684 programmably couples the output of primary LUT 635 and an output of secondary LUT 680 to a combinatorial output 687.

Combinatorial outputs 687 form a portion of LAB input-output lines 380 of FIG. 2 and are programmably connectable to the global interconnect structure, including long lines and double lines. Furthermore, as discussed earlier, in one embodiment, combinatorial outputs 687 are programmably connectable directly, to horizontal and vertical double lines 360 and 370. Moreover, combinatorial outputs 687 may be programmably connected through the global interconnect structure to LAB input-output lines 380 inputting into other LABS 200 or the same LAB 200 to form more complex logical functions from a combination of LABs 200.

In the embodiment shown in FIG. 3, combinatorial outputs 687 feed back into local interconnect structure 510 (not shown to simplify the drawing). As discussed earlier, local interconnect structure 510 is a fully, partially, or half-populated multiplexer region that allows coupling of these combinatorial outputs 687 to the inputs. Consequently, via local interconnect structure 510, combinatorial outputs 687 may be programmably coupled to inputs of the primary LUTs and dedicated inputs, without using interconnect resources outside the LAB such as global interconnect conductors.

In LAB 200 of FIG. 3, there are eight storage blocks 691. A primary four-input LUT may be programmably coupled to a storage block 691 for providing a registered output 689. In particular, for the first grouping of LUTs, a data input of storage block 691 may be programmably coupled to signals from dedicated input 654, the output of primary LUT 601, and the output of secondary LUT 670. More specifically, a multiplexer 684 programmably couples to this data input of storage block 691 signals from: dedicated input 654 and the output of another multiplexer 684 (discussed earlier as being coupled to combinatorial output 687), which programmably selects between the output of primary LUT 601 and the output of secondary LUT 670. These configuration paths could have been obtained using other circuitry such as a three-input multiplexer. However, two two-input multiplexers 684 were used in the embodiment of FIG. 3 since one multiplexer 684 is used for combinatorial output 687. This is similarly the case for the other storage blocks 691.

Further, a data input of a storage block 691 may be programmably coupled to dedicated input 656, the output of primary LUT 605, and the output of secondary LUT 672. In particular, a multiplexer 684 programmably couples to this data input of storage block 691 signals from: dedicated input 656 and the output of another multiplexer 684 (discussed earlier as being coupled to combinatorial output 687), which programmably selects between the output of primary LUT 605 and the output of secondary LUT 672. A data input of a storage block 691 may be programmably coupled to dedicated input 658, the output of primary LUT 610, and the output of secondary LUT 672. In particular, a multiplexer 684 programmably couples to this data input of storage block 691 signals from: dedicated input 658 and the output of another multiplexer 684 (discussed earlier as being coupled to combinatorial output 687), which programmably selects between the output of primary LUT 610 and the output of secondary LUT 672. A data input of a storage block 691 may be programmably coupled to dedicated input 660, the output of primary LUT 615, and the output of secondary LUT 674. In particular, a multiplexer 684 programmably couples to this data input of storage block 691 signals from: dedicated input 660 and the output of another Multiplexer 684 (discussed earlier as being coupled to combinatorial output 687), which programmably selects between the output of primary LUT 615 and the output of secondary LUT 674.

Similarly, for the second grouping of LUTs, a data input of a storage block 691 may be programmably coupled to dedicated input 662, the output of primary LUT 620, and the output of secondary LUT 676. In particular, a multiplexer 684 programmably couples to this data input of storage block 691 signals from: dedicated input 662 and the output of another multiplexer 684 (discussed earlier as being coupled to combinatorial output 687), which programmably selects between the output of primary LUT 620 and the output of secondary LUT 676. A data input of a storage block 691 may be programmably coupled to dedicated input 664, the output of primary LUT 625, and the output of secondary LUT 678. In particular, a multiplexer 684 programmably couples to this data input of storage block 691 signals from: dedicated input 664 and the output of another multiplexer 684 (discussed earlier as being coupled to combinatorial output 687), which programmably selects between the output of primary LUT 625 and the output of secondary LUT 678. A data input of a storage block 691 may be programmably coupled to dedicated input 666, the output of primary LUT 630, and the output of secondary LUT 678. In particular, a multiplexer 684 programmably couples to this data input of storage block 691 signals from: dedicated input 666 and the output of another multiplexer 684 (discussed earlier as being coupled to combinatorial output 687), which programmably selects between the output of primary LUT 630 and the output of secondary LUT 678. A data input of a storage block 691 may be programmably coupled to dedicated input 666, the output of primary LUT 635, and the output of secondary LUT 680. In particular, a multiplexer 684 programmably couples to this data input of storage block 691 signals from: dedicated input 668 and the output of another multiplexer 684 (discussed earlier as being coupled to combinatorial output 687), which programmably selects between the output of primary LUT 635 and the output of secondary LUT 680.

Storage blocks 691 are used to store a logic state. Many different logical components can be used to form storage blocks 691 including, among others, memory cells, D, T, S-R, J-K, and other types of latches and registers. For example, in the embodiment shown in FIG. 3, storage blocks 691 are D-type registers. In other embodiments of the present invention, LAB 200 may contain T, S-R, J-K, and other types of latches and registers, and combinations of these. Furthermore, in another embodiment, storage block 691 is programmably configurable to operate also as a transparent latch.

LAB 200 has CLK0 693, CLK1 694, CE 696, S 697, R 698, and DIN 699 input lines. These lines govern the functionality, which are sometimes referred to as the "secondary functions," of storage blocks 691. These lines form a portion of LAB input-output lines 380 (described above), which may be programmably connected to LABs, input-output drivers, or any other suitable signal sources via the global interconnection resources, which include switch boxes 310, double lines 360 and 370, and long lines 340 and 350.

In typical operation, storage block 691 latches in data from its data input, and outputs data at its output 689 in response to a clock signal input. A multiplexer 684 programmably couples a CLK0 693 signal or a CLK1 694 signal to the clock signal input of storage block 691. The embodiment shown in FIG. 3 has eight of these multiplexers 684, which are coupled to the clock signal inputs of storage blocks 691, one multiplexer 684 for a storage block 691. Depending on how multiplexer 684 is configured, the clock signal input of storage block 691 can be controlled by either CLK0 693 or CLK1 694 signals. Furthermore, since multiplexers 684 can be programmably configured independently for the eight storage blocks 691, a portion of the registers in LAB 200 may be controlled by CLK0 693, while the other portion is controlled by CLK1 694. Eight storage blocks 691 may be also controlled by the same CLK0 693 signal or CLK1 694 signal.

Figure 4:
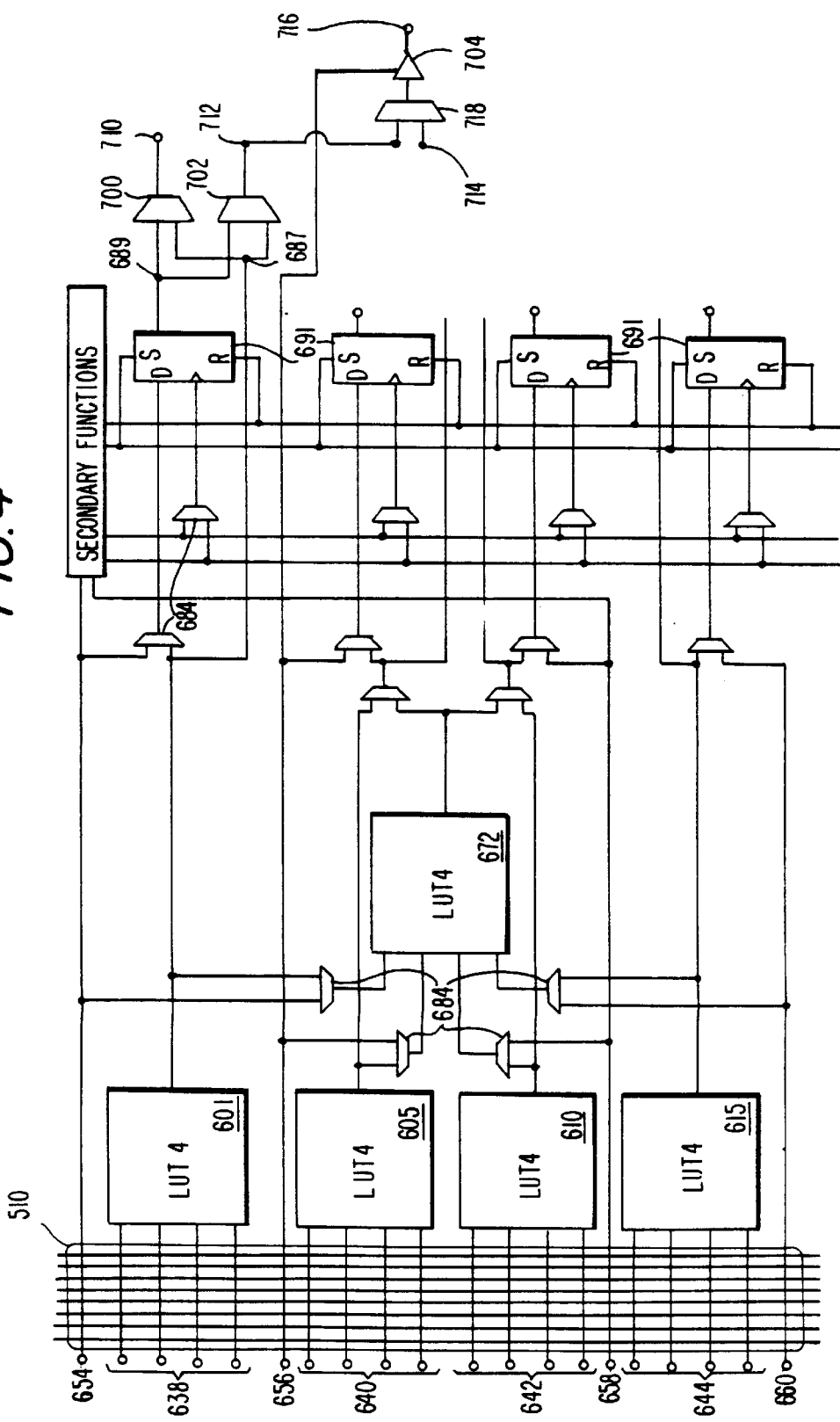
FIG. 4 is a more detailed, but still simplified, schematic block diagram of an illustrative embodiment of a representative portion of the FIG. 1 apparatus in accordance with this invention.

FIG. 4 shows an expanded view of a portion of LAB 200 of FIG. 3, in accordance with the present invention. In particular, FIG. 4 shows a group of five LUTs 601, 605, 610, 615, and 672, arranged in a cascade configuration, as described above. The fifth LUT 672 is a cascaded LUT and can also be accessed directly from input lines 654, 656, 658, and 660. A tri-statable buffer, tri-state driver 704, is driven by a multiplexer 718. Multiplexer 718 has two inputs: a first input is coupled to receive the output of multiplexer 702 and a second input 714 is coupled to receive a signal from horizontal or vertical single, double, or long lines 385, 340, 350, 360, 370 (see FIG. 2).

The control signal for tri-state driver 704 is derived from the signal provided to output 656, also one of the same signals that can be used to access the fifth LUT 672. The output 716 of driver 704 can be connected to one or more horizontal or vertical single, double, or long lines 385, 340, 350, 360, 370 (see again FIG. 2), although it will be appreciated that the power of driver 704 tends to be needed most for driving longer lines such as 340 and 350.

The combination of driver 704 and multiplexer 718 can be used to effect a "turn" from a horizontal long line 340 to a vertical long line 350, or vice versa, or between any other types of horizontal and vertical conductors, depending on the connectivity of input 714 and output 716.

As shown in FIG. 4, multiplexer 702 is associated with a particular pair of combinatorial and registered outputs. In the embodiment shown in FIG. 4, multiplexer 702 receives the combinatorial and registered outputs 687 and 689 that are nominally associated with the first LUT 601. However, it should be noted that multiplexer 702 may be associated with any of the four pairs of combinatorial and registered outputs available in the depicted representative portion of LAB 200. (If the multiplexer 702 which supplies one of the inputs to multiplexer 718 is associated with the first or fourth pair of outputs 687 and 689, the signal applied to that multiplexer 718 input will be derivable only from a first-level LUT 601 or 615. On the other hand, if the multiplexer 702 which supplies a multiplexer 718 input is associated with the second or third pair of outputs 687 and 689, the signal applied to that multiplexer 718 input can be derived from second level LUT 672.) In addition to multiplexer 702, a multiplexer 700 can be provided. The inputs of multiplexer 700 are the combinatorial and registered outputs 687, 689 that are also applied to multiplexer 702. The output of multiplexer 700 can be coupled to feed back into local interconnect structure 501.

Although FIG. 4 shows only four primary LUTs 601, 605, 610, 615 and one secondary LUT 672, it will be understood that this structure may be repeated two or more times in each LAB. For example, the circuitry shown in FIG. 5, which will next be discussed in detail, assumes that each LAB 200 includes four repetitions of the FIG. 4 circuitry.

Figure 5:
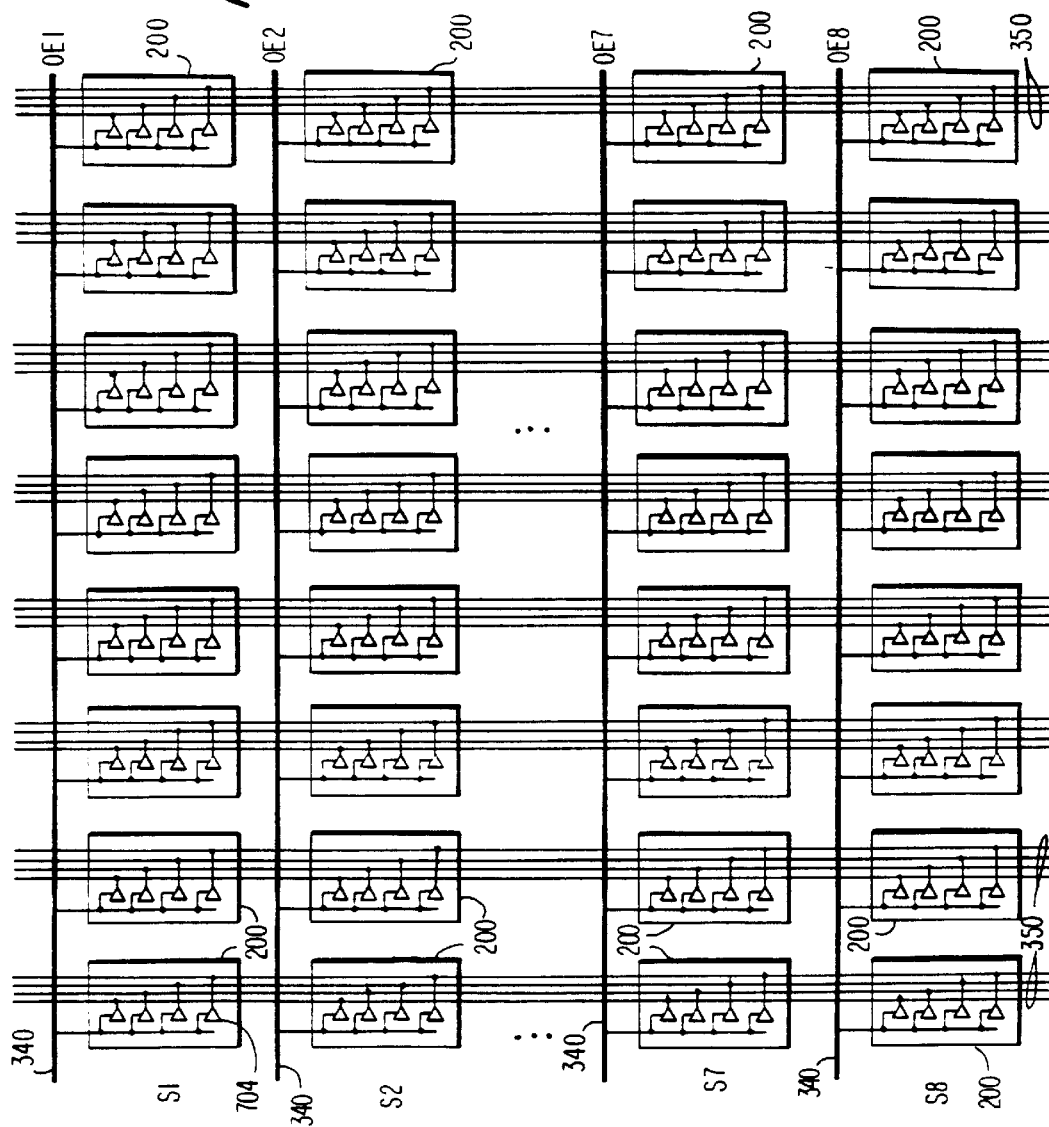
FIG. 5 is a simplified block diagram of representative portions of another illustrative embodiment of a programmable logic device constructed in accordance with the invention.

FIG. 5 shows how circuitry of the type shown in FIG. 4 can be used to enable a PLD to efficiently perform extensive signal multiplexing functions. For example, FIG. 5 shows PLD circuitry that can implement a 32-bit bus with eight sources S1, ..., S8. Each source S1–S8 is a row of LABs 200, each of which includes four repetitions of circuitry of the type shown in FIG. 4. In FIG. 5 only the tri-state drivers 704 (four in each LAB 200) are shown (the other components of LABs 200 are omitted for clarity). Each of four vertical long lines associated with each column of LABs can be driven by a respective one of the four tri-state drivers 704 in each of the LABs in that column. Output enable signals OE1, ..., OE8 are provided via horizontal long lines 340, each output enable signal being associated with a respective one of LAB rows S1–S8. A single output enable signal associated with any LAB row can enable all 32 tri-state drivers 704 in the LABs in that row. Thus selection of which of signals OE1-OE8 is output-enabling controls which of LAB rows S1–S8 acts as the source of data signals for the 32 depicted vertical long lines 350.

Figure 6:
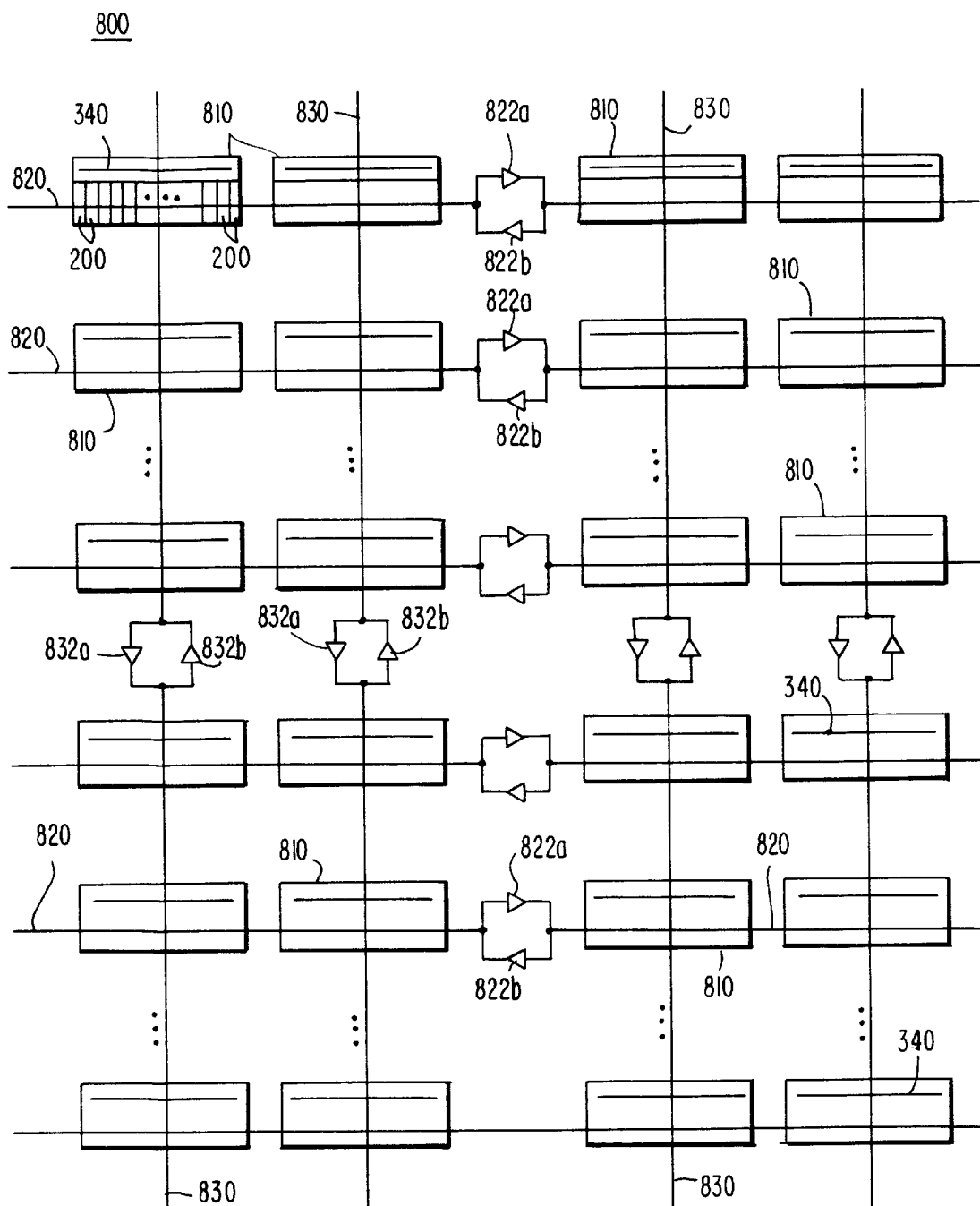
FIG. 6 is a simplified block diagram of representative portions of still another illustrative embodiment of a programmable logic device which can be constructed in accordance with the invention.

FIG. 6 shows another illustrative context in which circuitry of the type shown in FIGS. 4 and 5 can be used. In the PLD 800 shown in part in FIG. 6, LABs 200 are grouped in super-regions 810 including several (e.g., 16) LABs each. Individual LABs 200 are only shown in the upper-left-most super-region 810 in FIG. 8, but it will be understood that all of the super-regions are similarly constructed. The LABs 200 in each super-region 810 are served by horizontal conductors 340 that are relatively long and are therefore somewhat like horizontal long lines 340 in FIG. 2. In addition to these conductors 340, the LABs 200 in each super-region 810 are served by local conductors that are not shown in FIG. 8 but that may be similar to the local single lines 385 shown in FIG. 2. Thus local lines 385 are generally usable for conveying signals to, from, and between individual logic modules or subregions in each LAB or region 200, while conductors 340 are generally usable for conveying signals to, from, and between LABs in a super-region 810.

Super-regions 810 are disposed on PLD 800 in a two-dimensional array of intersecting rows and columns of such super-regions. Horizontal inter-super-region interconnection conductors 820 are associated with each super-region row, and vertical inter-super-region interconnection conductors 830 are associated with each super-region column. In general, horizontal conductors 820 are usable for conveying signals to, from, and between the super-regions 810 in the associated row, while vertical conductors 830 are usable for conveying signals to, from, and between the super-regions in the associated column. It will be appreciated that all the various conductors that have been mentioned have uses other than those mentioned specifically above. For example, conductors 830 may be used for conveying signals between conductors 820 in two different rows, conductors 820 may be used for conveying signals between conductors 830 in two different columns, etc.

Rather than extending uninterruptedly all the way across PLD 800, each conductor 820 is programmably segmented at its midpoint. Thus a programmable tri-state driver 822a in each conductor 820 can be used to allow the left-hand half of that conductor to drive the right-hand half. Alternatively, a programmable tri-state driver 822b in each conductor 820 can be used to allow the right-hand half of that conductor to drive the left-hand half. As still another possibility, both of the drivers 822 associated with a conductor 820 may be tri-stated, thereby allowing the left and right halves to be used individually. The same construction and modes of operation are provided by programmable tri-state drivers 832 at the midpoint of each vertical conductor 830.

Each of LABs 200 in FIG. 6 may be constructed in accordance with this invention as shown in representative part in FIG. 4. In the context of a PLD architecture like that shown in FIG. 6 each LAB 200 may include several (e.g., four) repetitions of the FIG. 4 circuitry. Each input 714 in each LAB 200 may be connected (typically but not necessarily programmably) to one or more conductors 340, 820, and/or 830 adjacent to that LAB. Each output 716 in each LAB 200 may be connected (typically but not necessarily programmably) to one or more conductors 340, 820, and/or 830 adjacent to that LAB. Thus each pair of elements 704/718 in each LAB 200 can be used to drive signals either from the LAB or from adjacent conductors 340/820/830 onto other adjacent conductors 340/820/830. For example, element pairs 704/718 can be used to make horizontal-to-vertical or vertical-to-horizontal "turns" between adjacent horizontal and vertical conductors. Element pairs 704/718 can also be used to shift signals between different levels in the interconnection conductor hierarchy (e.g., from relatively low-level conductors 340 to relatively high-level conductors 820/830 or vice versa).

Multiplexers structures in accordance with this invention (e.g., as shown in FIG. 5) can be readily implemented in PLD architectures of the type shown in FIG. 6. For example, each source S1–S8 in FIG. 5 can be the appropriate number of LABs 200 in a respective row in FIG. 6. The OE signals in FIG. 5 can be placed on respective horizontal conductors 340 and/or 820 in FIG. 6. And the multiplexer outputs (on conductors 350 in FIG. 5) can be placed on conductors 830 in FIG. 6.

Figure 7:
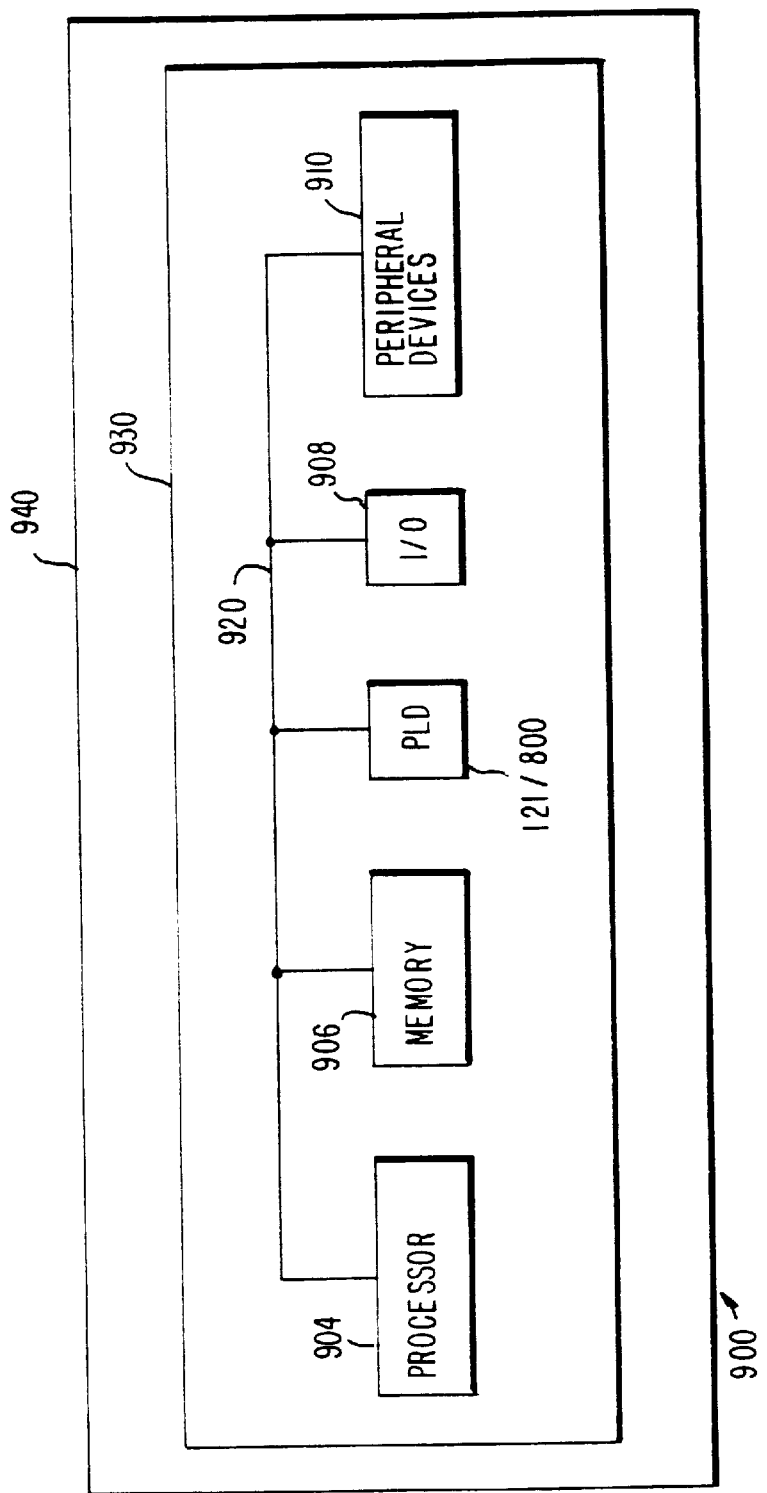
FIG. 7 is a simplified block diagram of an illustrative system employing a programmable logic device in accordance with the invention.

FIG. 7 illustrates a programmable logic device 121 or 800 in accordance with this invention in a data processing system 900. In addition to device 121/800, data processing system 900 may include one or more of the following components: a processor 904; memory 906; I/O circuitry 908; and peripheral devices 910. These components are coupled together by a system bus 920 and are populated on a printed circuit board 930 which is contained in an end-user system 940.

System 900 can be used in a wide variety of applications, such as computer networking, data networking, instrumentation, video processing, digital signal processing, or any other application where the advantage of using programmable or reprogrammable logic is desirable. Programmable logic device 121/800 can be used to perform a variety of different logic functions. For example, programmable logic device 121/800 can be configured as a processor or controller that works in cooperation with processor 904. Programmable logic device 121/800 may also be used as an arbiter for arbitrating access to a shared resource in system 900. In yet another example, programmable logic device 121/800 can be configured as an interface between processor 904 and one of the other components in system 900. It should be noted that system 900 is only exemplary, and that the true scope and spirit of the invention should be indicated by the following claims.

Various technologies can be used to implement programmable logic devices employing this invention, as well as the various components of those PLDs. For example, each programmable switch or multiplexer (e.g., elements 310, 510, 684, etc.; generically referred to as programmable logic connectors or "PLCs") can be a relatively simple programmable connector such as a switch or a plurality of switches for connecting any one of several inputs to an output. Alternatively, each PLC can be a somewhat more complex element which is capable of performing logic (e.g., by logically combining several of its inputs) as well as making a connection. In the latter case, for example, each PLC can be product term logic, implementing functions such as AND, NAND, OR, or NOR. Examples of components suitable for implementing PLCs are EPROMs, EEPROMs, pass transistors, transmission gates, antifuses, laser fuses, metal optional links, etc. The components of PLCs can be controlled by various, programmable, function control elements ("FCEs"). (With certain PLC implementations (e.g., fuses and metal optional links) separate FCE devices are not required.) FCEs can also be implemented in any of several different ways. For example, FCEs can be SRAMs, DRAMs, first-in first-out ("FIFO") memories, EPROMs, EEPROMs, function control registers (e.g., as in Wahlstrom U.S. Pat. No. 3,473,160), ferro-electric memories, fuses, antifuses, or the like. FCEs (made using any of these technologies) can also be used to implement or control LUTs. From the various examples mentioned above it will be seen that this invention is applicable to both one-time-only programmable and reprogrammable devices.

It will be understood that the foregoing is only illustrative of the principles of this invention and that various modifications can be made by those skilled in the art without departing from the scope and spirit of the invention. For example, the number of logic modules (subregions; LUTs and registers) in a LAB 200 can be varied. Similarly, the number of LABs (regions) 200 in a super-region 810 can be varied. The number of rows and columns of LABs 200 or super-regions 810 in a PLD can be varied. The numbers of the various types of interconnection resources such as conductors, PLCs, drivers, and the like can all be varied as desired. Various types of programmable logic can be used in the subregions, and various technologies can be used for the PLCs and other elements of the device, all as suggested above.

What is claimed is:

1. A programmable logic array integrated circuit organized as a two-dimensional array of cells comprising:
   a first plurality of conductors extending along a first dimension of said two-dimensional array;
   a second plurality of conductors extending along a second dimension of said two-dimensional array, said second plurality of conductors programmably coupled to said first plurality of conductors; and
   a plurality of logic array blocks, wherein a logic array block comprises:
      a plurality of first-level programmable function blocks configured to implement logic functions;
      a second-level programmable function block, programmably coupled to said plurality of first-level programmable function blocks, without passing through said first plurality of conductors and said second plurality of conductors, said second-level programmable function block configured to implement logic functions of outputs from said plurality of first-level programmable function blocks;
      tri-state buffer circuitry configured to receive data signals from at least one of said programmable function blocks and at least one of said conductors, and further configured to select and buffer one of the data signals thus received and to apply that data signal to at least one other of said conductors; and
      a plurality of dedicated inputs programmably coupled to said second-level programmable function block.

2. The circuit defined in claim 1 wherein said tri-state buffer circuitry includes:
   a register configured to register said data signal received from said at least one of said programmable function blocks; and
   switching circuitry configured to programmably select said data signal received from said at least one of said programmable function blocks either before or after registration by said register as a signal that the tri-state buffer circuitry can buffer and apply to said at least one other of said conductors.

3. The circuit defined in claim 1 wherein said tri-state buffer circuitry includes a tri-state control input terminal connected to one of said dedicated inputs.

4. The circuit defined in claim 3 wherein the dedicated inputs to which the tri-state control input terminals are connected in a first subplurality of the logic array blocks are connectable to a common one of said conductors.

5. The circuit defined in claim 4 wherein the at least one of said conductors are all different for all of the logic array blocks in the first subplurality.

6. The circuit defined in claim 5 wherein the common one of said conductors is selected from a first one of said first and second pluralities of conductors, and wherein the at least one others of said conductors for all of the logic array blocks in the first subplurality are selected from a second one of said first and second pluralities of conductors.

7. The circuit defined in claim 4 wherein the first subplurality is one of a plurality of similar subpluralities, and wherein the common one of said conductors for each of said subpluralities is different than the common one of said conductors for all others of said subpluralities.

8. The circuit defined in claim 7 wherein the at least one other of said conductors for each of the logic array blocks in each of said subpluralities is common for a respectively associated one of the logic array blocks in each of the others of said subpluralities.

9. The circuit defined in claim 8 wherein the common ones of said conductors for all of said subpluralities are selected from a first one of said first and second pluralities of conductors, and wherein the at least one others of said conductors for all of the logic array blocks in all of said subpluralities are selected from a second one of said first and second pluralities of conductors.

10. A digital processing system comprising:

processing circuitry;

a memory coupled to said processing circuitry; and a programmable logic array integrated circuit as defined in claim 1 coupled to the processing circuitry and the memory.

11. A printed circuit board on which is mounted a programmable logic array integrated circuit as defined in claim 1.

12. The printed circuit board defined in claim 11 further comprising:

a memory mounted on the printed circuit board and coupled to the memory circuitry.

13. The printed circuit board defined in claim 11 further comprising:

processing circuitry mounted on the printed circuit board and coupled to the memory circuitry.

* * * * *